(12) United States Patent
Chou et al.

(10) Patent No.: US 10,075,136 B2
(45) Date of Patent: Sep. 11, 2018

(54) POWER AMPLIFIER

(71) Applicant: REALTEK SEMICONDUCTOR CORPORATION, Hsinchu (TW)

(72) Inventors: Chien-I Chou, Taipei (TW); Ka-Un Chan, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/823,159

(22) Filed: Nov. 27, 2017

(65) Prior Publication Data

US 2018/0152152 A1 May 31, 2018

(30) Foreign Application Priority Data

Nov. 29, 2016 (TW) .............................. 105139173 A

(51) Int. Cl.
| | | |
|---|---|---|
| *H03F 1/30* | (2006.01) | |
| *H03F 1/02* | (2006.01) | |
| *H03F 3/20* | (2006.01) | |
| *H03F 3/217* | (2006.01) | |

(52) U.S. Cl.
CPC ........... *H03F 1/303* (2013.01); *H03F 1/0227* (2013.01); *H03F 1/0261* (2013.01); *H03F 3/20* (2013.01); *H03F 3/217* (2013.01)

(58) Field of Classification Search
CPC ....................................................... H03F 1/303
See application file for complete search history.

(56) References Cited

U.S. PATENT DOCUMENTS

| | | | | |
|---|---|---|---|---|
| 7,498,876 B2* | 3/2009 | Peruzzi | ................. | H03F 1/0222 330/10 |
| 2007/0018719 A1* | 1/2007 | Seven | ................... | H03F 1/0277 330/51 |
| 2010/0130249 A1* | 5/2010 | Tam | ...................... | H03F 1/0277 455/556.1 |
| 2011/0043278 A1* | 2/2011 | Adams | .................... | H03F 1/307 330/69 |
| 2011/0065413 A1* | 3/2011 | Singer | ............... | H04W 52/0229 455/343.2 |

(Continued)

OTHER PUBLICATIONS

Wong et al., A 1V 5mA multimode IEEE 802.15.6/Bluetooth low-energy WBAN transceiver for biotelemetry applications, IEEE ISSCC Dig. Tech. Papers, 2012, pp. 300-301.

(Continued)

*Primary Examiner* — Patricia T Nguyen
(74) *Attorney, Agent, or Firm* — WPAT, PC

(57) ABSTRACT

The present invention discloses a power amplifier capable of adaptively operating in one of an energy efficient mode and a high output power mode. An embodiment of the power amplifier includes a first transistor, a second transistor, a first bias element, a second bias element, a third bias element and a plurality of switches. In the energy efficient mode, by the control over the on/off states of the switches, an inverter type power amplifier is realized with the first transistor, the second transistor, the second bias element and the third bias element. In the high output power mode, by the control over the on/off states of the switches, a common source amplifier or a common emitter amplifier is realized with the second transistor and the first bias element.

10 Claims, 5 Drawing Sheets

(56) References Cited

U.S. PATENT DOCUMENTS

| | | | | |
|---|---|---|---|---|
| 2014/0009233 A1* | 1/2014 | Cabrera | ............... | H03F 1/0277 330/273 |
| 2015/0049883 A1* | 2/2015 | Ibrahim | ................. | H03F 3/181 381/118 |
| 2015/0236651 A1* | 8/2015 | Yang | .................... | H03F 1/0205 330/251 |
| 2017/0133989 A1* | 5/2017 | Dykstra | ............... | H03F 1/3205 |

OTHER PUBLICATIONS

Prummel et al., A 10 mW Bluetooth Low-Energy transceiver with onchip matching, J. Solid-State Circuits, vol. 50, No. 12, pp. 3077-3088, Dec. 2015.

\* cited by examiner

POWER AMPLIFIER

BACKGROUND OF THE INVENTION

1. Field of the Invention

The present invention relates to an amplifier, especially to a power amplifier.

2. Description of Related Art

Generally, an inverter-type power amplifier consumes less power while a common source power amplifier has higher output power. The two kinds of amplifiers are suitable for different applications. Regarding a power amplifier consuming a lot of power in a radio-frequency (RF) transceiver, if the RF transceiver takes the issue of power consumption as the first priority, the inverter-type power amplifier will be the better choice, and if the RF transceiver takes the operation performance (e.g., the maximum distance of transmission) as the first priority, the common source power amplifier will be preferable.

This industrial field looks forward to a circuit having the advantages of the aforementioned two kinds of amplifiers.

People who are interested in the inverter-type power amplifier may refer to the following literature:
(1) Jan Prummel et al., "*A 10 mW Bluetooth Low-Energy transceiver with onchip matching*", IEEE J. Solid-State Circuits, vol. 50, no. 12, pp. 3077-3088, December 2015.

People who are interested in the common source power amplifier may refer to the following literature:
(1) Alan Wong et al., "*A 1V 5 mA multimode IEEE 802.15.6/Bluetooth low-energy WBAN transceiver for biotelemetry applications*", IEEE ISSCC Dig. Tech. Papers, 2012, pp. 300-301.

SUMMARY OF THE INVENTION

An object of the present invention is to provide a power amplifier capable of adaptively operating in one of an energy efficient mode and a high output power mode.

The present invention discloses a power amplifier capable of operating in one of an energy efficient mode and a high output power mode. An embodiment of the power amplifier comprises a first transistor, a second transistor, a first bias component, a second bias component, a third bias component, a first switch, a second switch, a third switch, a fourth switch, a fifth switch, a sixth switch and a seventh switch. The first transistor includes a first high voltage terminal, a first low voltage terminal and a first control terminal, in which the first high voltage terminal is coupled to a first high voltage supply terminal and the first low voltage terminal is coupled to a signal output terminal. The second transistor includes a second high voltage terminal, a second low voltage terminal and a second control terminal, in which the second high voltage terminal is coupled to the signal output terminal, the second low voltage terminal is coupled to a low voltage supply terminal, and the second control terminal is coupled to a signal input terminal. The first bias component is coupled to a first load bias terminal. The second bias component is coupled to a second load bias terminal. The first switch is coupled between the high voltage supply terminal and the first control terminal, and configured to be turned off according to a control signal in the energy efficient mode and turned on according to the control signal in the high output power mode. The second switch is coupled between the signal input terminal and the first control terminal, and configured to be turned on according to the control signal in the energy efficient mode and turned off according to the control signal in the high output power mode. The third switch is coupled between the signal input terminal and the third bias component, and configured to be turned on according to the control signal in the energy efficient mode and turned off according to the control signal in the high output power mode. The fourth switch is coupled between the third bias component and the signal output terminal, and configured to be turned on according to the control signal in the energy efficient mode and turned off according to the control signal in the high output power mode. The fifth switch is coupled between the second control terminal and a transistor bias terminal, and configured to be turned off according to the control signal in the energy efficient mode and turned on according to the control signal in the high output power mode. The sixth switch is coupled between the first bias component and the signal output terminal, and configured to be turned off according to the control signal in the energy efficient mode and turned on according to the control signal in the high output power mode. The seventh switch is coupled between the signal output terminal and the second bias component, and configured to be turned on according to the control signal in the energy efficient mode and turned off according to the control signal in the high output power mode. Accordingly, the power amplifier acts as an inverter-type power amplifier in the energy efficient mode, and acts as a common source/emitter power amplifier in the high output power mode.

Another embodiment of the aforementioned power amplifier comprises a first transistor, a second transistor, a first bias component, a second bias component, a third bias component and a plurality of switches. The first transistor includes a first high voltage terminal, a first low voltage terminal and a first control terminal, in which the first high voltage terminal is coupled to a high voltage supply terminal, the first low voltage terminal is coupled to a signal output terminal, and the first control terminal is coupled to a signal input terminal in the energy efficient mode. The second transistor includes a second high voltage terminal, a second low voltage terminal and a second control terminal, in which the second high voltage terminal is coupled to the signal output terminal, the second low voltage terminal is coupled to a low voltage supply terminal, and the second control terminal is coupled to the signal input terminal. The first bias component is coupled to a first load bias terminal, in which the first bias component is not coupled to the signal output terminal in the energy efficient mode and coupled to the signal output terminal in the high output power mode. The second bias component is coupled to a second load bias terminal, in which the second bias component is coupled to the signal output terminal in the energy efficient mode and not coupled to the signal output terminal in the high output power mode. The third bias component is coupled between the signal input terminal and the signal output terminal in the energy efficient mode, and not coupled to the signal input terminal and the signal output terminal in the high output power mode. Each of the plurality of switches is turned on or off according to a control signal in the energy efficient mode, and turned on or off according to the control signal in the high output power mode; these switches allow the first transistor, the second transistor, the second bias component and the third bias component to act as an inverter-type power amplifier in the energy efficient mode, and allow the second transistor and the first bias component to act as a common source amplifier or a common emitter amplifier in the high output power mode.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this industrial field. If any term is defined in the description, such term should be explained accordingly. Besides, the connection between two components in the disclosed embodiments can be direct or indirect provided that these embodiments are practicable under such connection. Said "indirect" means that an intermediate component is existed between the two components. Furthermore, the shape, size, and ratio of any component in the disclosed drawings are just exemplary for understanding, not for limiting the scope of the present invention.

The present invention discloses a power amplifier capable of adaptively operating in one of an energy efficient mode and a high output power mode. More specifically, the power amplifier is capable of operating in the energy efficient mode for power saving and operating in the high output power mode for operation performance.

Figure 1:
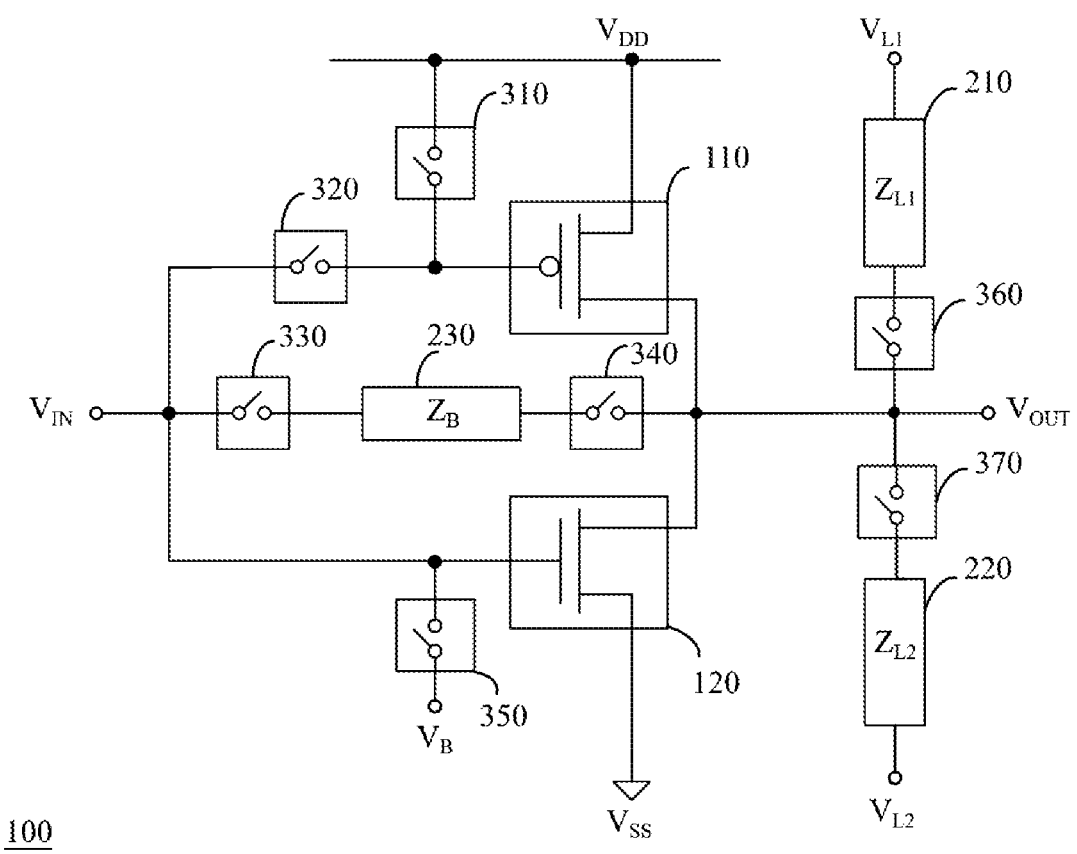
FIG. 1 illustrates a circuit diagram of a power amplifier according to an embodiment of the present invention.

FIG. 1 shows an embodiment of the power amplifier of the present invention. The power amplifier 100 of FIG. 1 includes a first transistor 110, a second transistor 120, a first bias component (i.e., $Z_{L1}$ in FIG. 1) 210, a second bias component (i.e., $Z_{L2}$ in FIG. 1) 220, a third bias component (i.e., $Z_B$ in FIG. 1) 230, a first switch 310, a second switch 320, a third switch 330, a fourth switch 340, a fifth switch 350, a sixth switch 360 and a seventh switch 370.

Please refer to FIG. 1. The first transistor 110 includes a first high voltage terminal, a first low voltage terminal and a first control terminal. The first high voltage terminal is coupled to a high voltage supply terminal $V_{DD}$, and the first low voltage terminal is coupled to a signal output terminal $V_{OUT}$. The second transistor 120 includes a second high voltage terminal, a second low voltage terminal and a second control terminal. The second high voltage terminal is coupled to the signal output terminal $V_{OUT}$, the second low voltage terminal is coupled to a low voltage supply terminal $V_{SS}$ which could be a grounding terminal or a non-grounding terminal, and the second control terminal is coupled to a signal input terminal $V_{IN}$. In this embodiment, an example of the first transistor 110 is a PMOS (p-type metal-oxide-semiconductor) transistor or a BJT (bipolar junction transistor), and an example of the second transistor 120 is an NMOS (n-type metal-oxide-semiconductor) transistor or a BJT.

Please refer to FIG. 1. The first bias component 210 is coupled to a first load bias terminal $V_{L1}$, and coupled to the signal output terminal $V_{OUT}$ through the sixth switch 360. The second bias component 220 is coupled to a second load bias terminal $V_{L2}$ (e.g., a terminal of any DC voltage that can be zero volt), and coupled to the signal output terminal $V_{OUT}$ through the seventh switch 370. The third bias component 230 is coupled to the signal input terminal $V_{IN}$ through the third switch 330, and coupled to the signal output terminal $V_{OUT}$ through the fourth switch 340. In this embodiment, each of the bias components 210~230 includes one of an inductor, a capacitor and a resistor. In another embodiment, each of the first bias component 210 and the second bias component 220 is an inductor or a capacitor, while the third bias component 230 is a resistor.

Please refer to FIG. 1. The first switch 310 is coupled between the high voltage supply terminal $V_{DD}$ and the first control terminal of the first transistor 110, and configured to be turned off according to a control signal in the energy efficient mode and turned on according to the control signal in the high output power mode, so as to switch off the first transistor 110 in the high output power mode. An example of the control signal is a signal generated by a digital control circuit capable of controlling the switches 310~370 according to predetermined setting (e.g., at least one of a user setting, a real-time detection result, and an operation state) and allowing the power amplifier 100 to operate in one of the energy efficient mode and the high output power mode. Since the digital control circuit and the way to implement the predetermined setting are well known in this industrial field, the details are omitted here. The second switch 320 is coupled between the signal input terminal $V_{IN}$ and the first control terminal of the first transistor 110, and configured to be turned on according to the control signal in the energy efficient mode and turned off according to the control signal in the high output power mode. The third switch 330 is coupled between the signal input terminal $V_{IN}$ and the third bias component 230, and configured to be turned on according to the control signal in the energy efficient mode and turned off according to the control signal in the high output power mode. The fourth switch 340 is coupled between the third bias component 230 and the signal output terminal $V_{OUT}$, and configured to be turned on according to the control signal in the energy efficient mode and turned off according to the control signal in the high output power mode. The fifth switch 350 is coupled between the control terminal of the second transistor 120 and a transistor bias terminal $V_B$, and configured to be turned off according to the control signal in the energy efficient mode and turned on according to the control signal in the high output power mode, so as to provide a proper bias for the second transistor 120. The sixth switch 360 is coupled between the first bias component 210 and the signal output terminal $V_{OUT}$, and configured to be turned off according to the control signal in the energy efficient mode and turned on according to the control signal in the high output power mode. The seventh switch 370 is coupled between the signal output terminal $V_{OUT}$ and the second bias component 220, and configured to be turned on according to the control signal in the energy efficient mode and turned off according to the control signal in the high output power mode. In this embodiment, each of the switches 310~370 includes one of an NMOS transistor, a PMOS transistor, a CMOS transmission-gate and a BJT.

Figure 2:
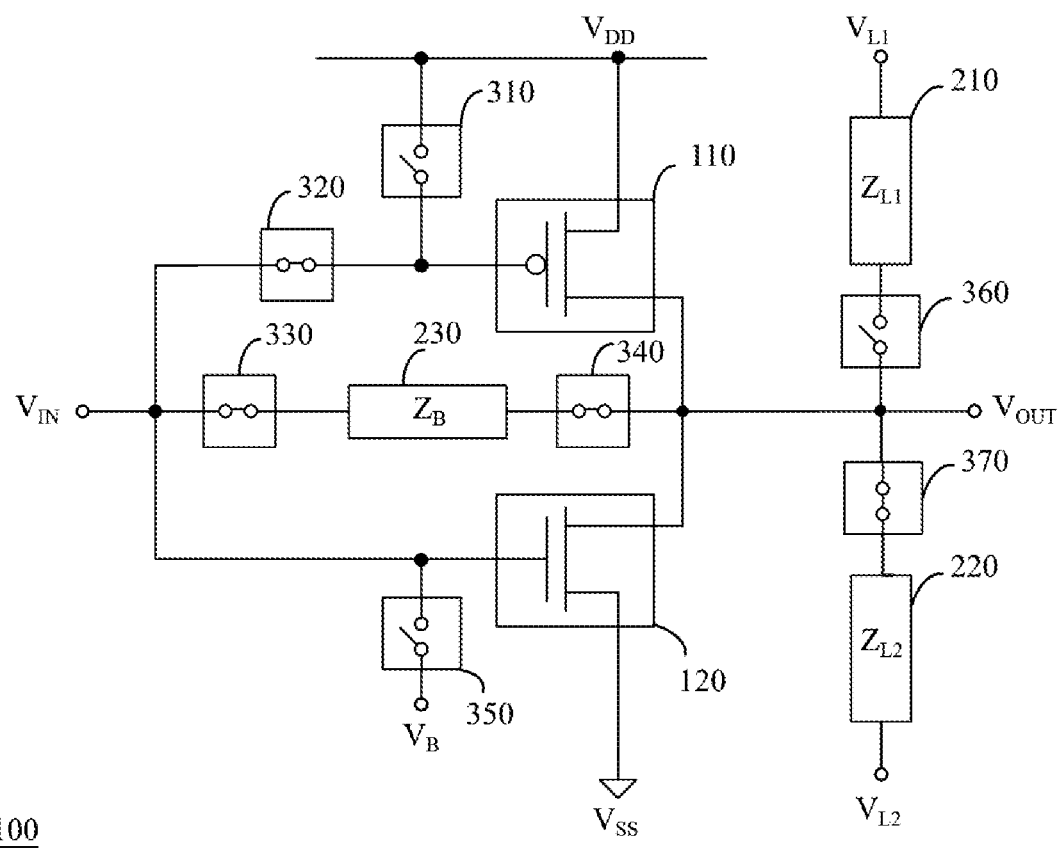
FIG. 2 illustrates an equivalent circuit diagram of the power amplifier of FIG. 1 in an energy efficient mode.
Figure 3:
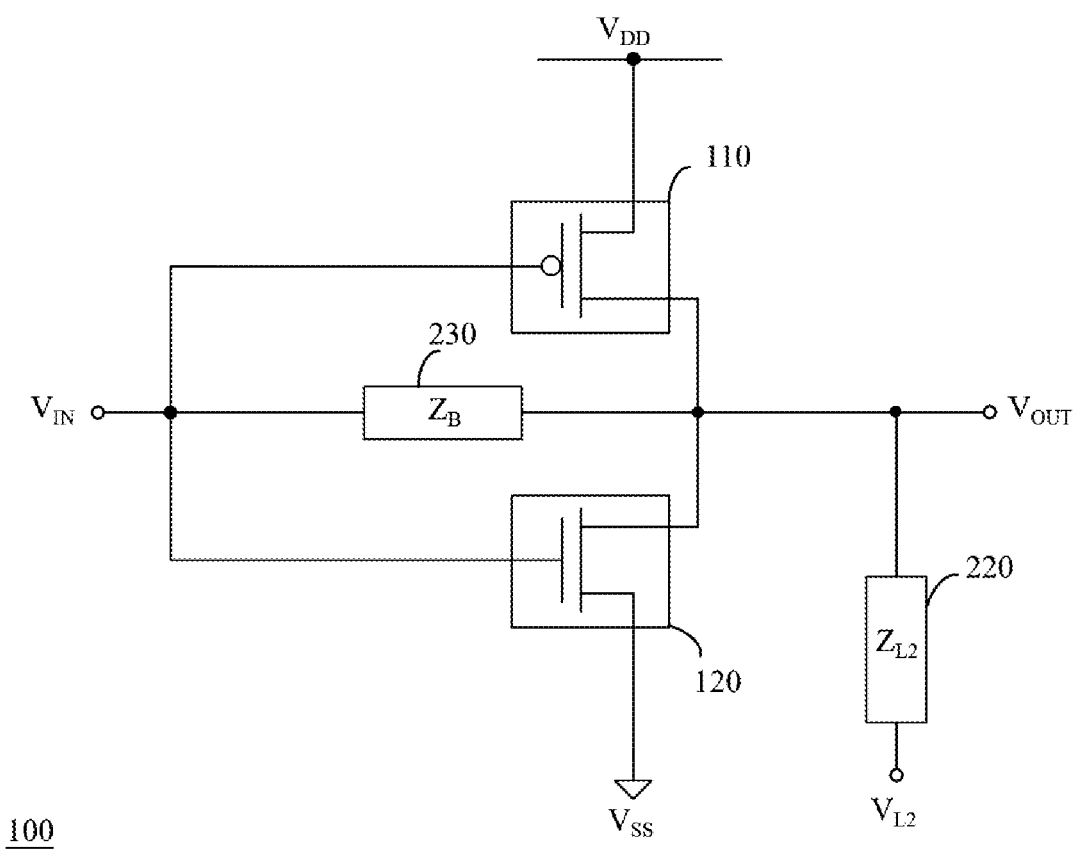
FIG. 3 illustrates another equivalent circuit diagram of the power amplifier of FIG. 1 in the energy efficient mode.
Figure 4:
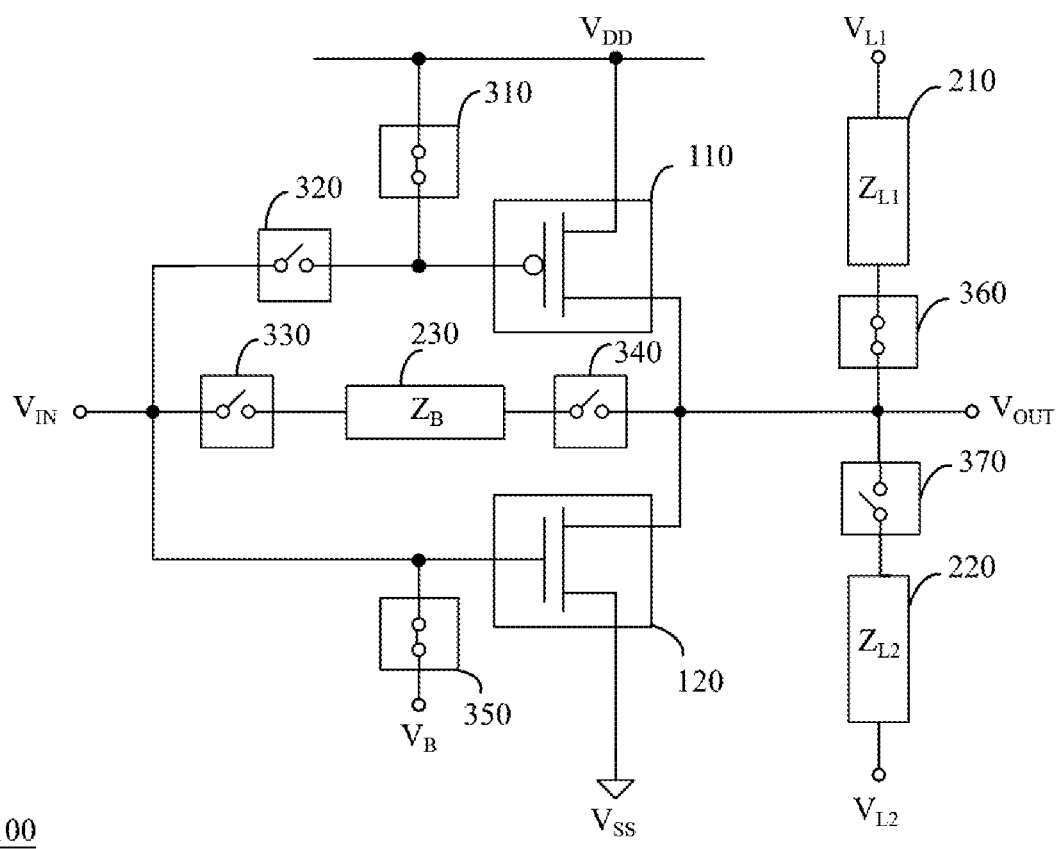
FIG. 4 illustrates an equivalent circuit diagram of the power amplifier of FIG. 1 in a high output power mode.
Figure 5:
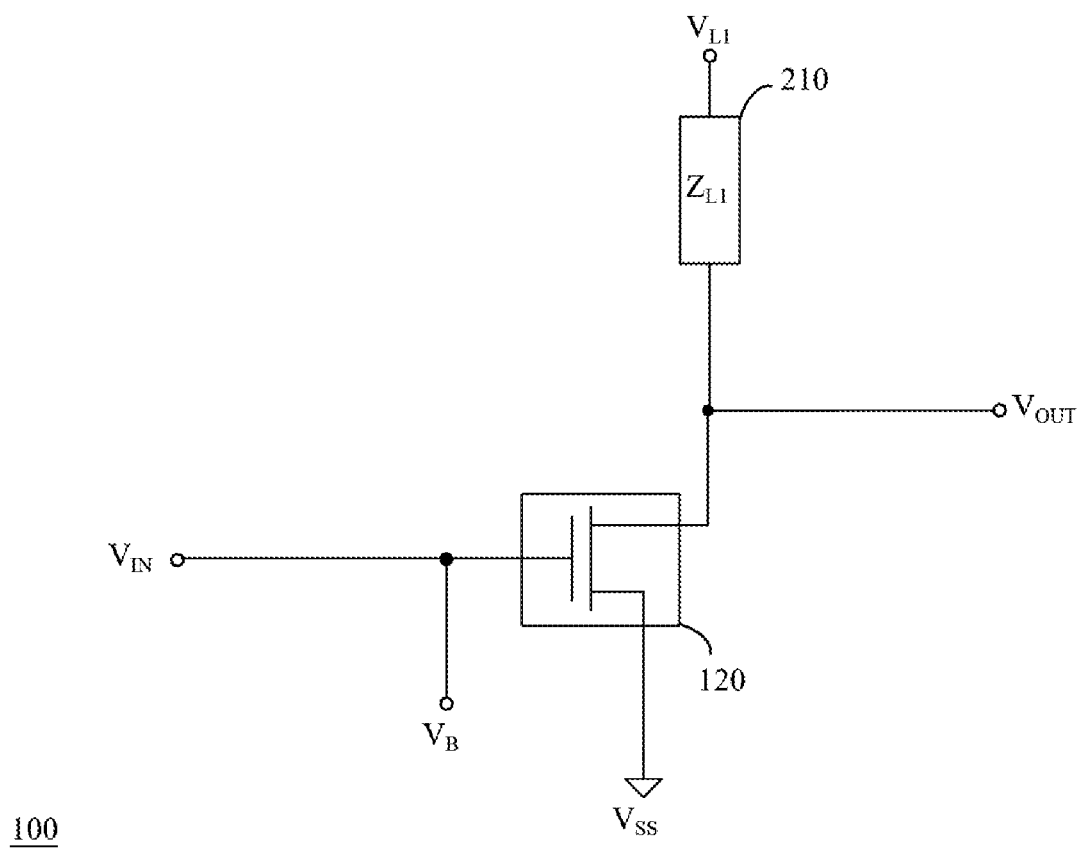
FIG. 5 illustrates another equivalent circuit diagram of the power amplifier of FIG. 1 in the high output power mode.

In light of the above, when the power amplifier 100 of FIG. 1 operates in the energy efficient mode, the circuit diagram of the power amplifier 100 can be simplified to be the equivalent as shown in FIG. 2 and FIG. 3, in which FIG. 3 omits the showing of the switches. In FIGS. 2 and 3, the power amplifier 100 includes the first transistor 110, the second transistor 120, the second bias component 220 and the third bias component 230 which jointly act as an inverter-type power amplifier. When the power amplifier 100 of FIG. 1 operates in the high output power mode, the circuit diagram of the power amplifier can be simplified to be the equivalent as shown in FIG. 4 and FIG. 5, in which FIG. 5 omits the showing of the switches and the first transistor 110 that is turned off. In FIG. 4 and FIG. 5, the power amplifier 100 includes the second transistor 120 and the first bias component 210 which jointly act as a common source amplifier or a common emitter amplifier.

The voltage at each of the aforementioned voltage supply terminals can be determined by people of ordinary skill in the art in accordance with their demands. Similarly, the voltage at each of the aforementioned bias terminals can be determined by those of ordinary skill in the art in accordance with their demands.

To sum up, the power amplifier of the present invention is capable of operating in the energy efficient mode when power saving has high priority, and capable of operating in the high output power mode when high output power has high priority. In other words, the power amplifier acts as an inverter-type power amplifier in the energy efficient mode for power saving, and acts as a common source/emitter amplifier in the high output power mode for operation performance. As a result, the power amplifier of the present invention has both the features of power saving and high output power.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A power amplifier capable of operating in one of an energy efficient mode and a high output power mode, the power amplifier comprising:
    a first transistor including a first high voltage terminal, a first low voltage terminal and a first control terminal, in which the first high voltage terminal is coupled to a first high voltage supply terminal and the first low voltage terminal is coupled to a signal output terminal;
    a second transistor including a second high voltage terminal, a second low voltage terminal and a second control terminal, in which the second high voltage terminal is coupled to the signal output terminal, the second low voltage terminal is coupled to a low voltage supply terminal, and the second control terminal is coupled to a signal input terminal;
    a first bias component coupled to a first load bias terminal;
    a second bias component coupled to a second load bias terminal;
    a third bias component;
    a first switch coupled between the high voltage supply terminal and the first control terminal, and configured to be turned off according to a control signal in the energy efficient mode and turned on according to the control signal in the high output power mode;
    a second switch coupled between the signal input terminal and the first control terminal, and configured to be turned on according to the control signal in the energy efficient mode and turned off according to the control signal in the high output power mode;
    a third switch coupled between the signal input terminal and the third bias component, and configured to be turned on according to the control signal in the energy efficient mode and turned off according to the control signal in the high output power mode;
    a fourth switch coupled between the third bias component and the signal output terminal, and configured to be turned on according to the control signal in the energy efficient mode and turned off according to the control signal in the high output power mode;
    a fifth switch coupled between the second control terminal and a transistor bias terminal, and configured to be turned off according to the control signal in the energy efficient mode and turned on according to the control signal in the high output power mode;
    a sixth switch coupled between the first bias component and the signal output terminal, and configured to be turned off according to the control signal in the energy efficient mode and turned on according to the control signal in the high output power mode; and
    a seventh switch coupled between the signal output terminal and the second bias component, and configured to be turned on according to the control signal in the energy efficient mode and turned off according to the control signal in the high output power mode.

2. The power amplifier of claim 1, wherein the first transistor is a PMOS transistor or a first bipolar junction transistor (BJT), and the second transistor is an NMOS transistor or a second BJT.

3. The power amplifier of claim 1, wherein each of the first switch, the second switch, the third switch, the fourth switch, the fifth switch, the sixth switch and the seventh switch includes one of an NMOS transistor, a PMOS transistor, a CMOS transmission-gate and a BJT.

4. The power amplifier of claim 1, wherein each of the first bias component, the second bias component and the third bias component includes one of an inductor, a capacitor and a resistor.

5. The power amplifier of claim 4, wherein each of the first bias component and the second bias component is one of an inductor and a capacitor, and the third bias component is a resistor.

6. The power amplifier of claim 1, wherein the power amplifier acts as an inverter-type power amplifier in the energy efficient mode, and acts as a common source amplifier or a common emitter amplifier in the high output power mode.

7. A power amplifier capable of operating one of an energy efficient mode and a high output power mode, the power amplifier comprising:
    a first transistor including a first high voltage terminal, a first low voltage terminal and a first control terminal, in which the first high voltage terminal is coupled to a high voltage supply terminal, the first low voltage terminal is coupled to a signal output terminal, and the first control terminal is coupled to a signal input terminal in the energy efficient mode and decoupled from the signal input terminal in the high output power mode;
    a second transistor including a second high voltage terminal, a second low voltage terminal and a second control terminal, in which the second high voltage terminal is coupled to the signal output terminal, the second low voltage terminal is coupled to a low voltage supply terminal, and the second control terminal is coupled to the signal input terminal;

a first bias component coupled to a first load bias terminal, in which the first bias component is not coupled to the signal output terminal in the energy efficient mode and coupled to the signal output terminal in the high output power mode;

a second bias component coupled to a second load bias terminal, in which the second bias component is coupled to the signal output terminal in the energy efficient mode and not coupled to the signal output terminal in the high output power mode;

a third bias component coupled between the signal input terminal and the signal output terminal in the energy efficient mode, and not coupled to the signal input terminal and the signal output terminal in the high output power mode; and a plurality of switches, in which each of the switches is turned on or turned off according to a control signal in the energy efficient mode, each of the switches is turned on or turned off according to the control signal in the high output power mode, the switches allow the first transistor, the second transistor, the second bias component and the third bias component to act as an inverter-type power amplifier in the energy efficient mode, and the switches allow the second transistor and the first bias component to act as a common source amplifier or a common emitter amplifier in the high output power mode.

8. The power amplifier of claim 7, wherein the first transistor is one of a PMOS transistor and a first BJT, and the second transistor is one of an NMOS transistor and a second BJT.

9. The power amplifier of claim 7, wherein each of the switches includes one of an NMOS transistor, a PMOS transistor, a CMOS transmission-gate and a BJT.

10. The power amplifier of claim 7, wherein each of the first bias component, the second bias component and the third bias component includes one of an inductor, a capacitor and a resistor.

* * * * *